(12) United States Patent
Akram

(10) Patent No.: US 6,190,945 B1
(45) Date of Patent: Feb. 20, 2001

(54) INTEGRATED HEAT SINK

(75) Inventor: Salman Akram, Boise, ID (US)

(73) Assignee: Micron Technology, Inc., Boise, ID (US)

(*) Notice: Under 35 U.S.C. 154(b), the term of this patent shall be extended for 0 days.

(21) Appl. No.: 09/082,953

(22) Filed: May 21, 1998

(51) Int. Cl.[7] .................... H01L 21/44; H01L 21/48; H01L 21/50
(52) U.S. Cl. .................... 438/122; 438/126; 438/127
(58) Field of Search .................... 438/127, 122, 438/126

(56) References Cited

U.S. PATENT DOCUMENTS

| | | | |
|---|---|---|---|
| 3,029,505 | * | 4/1962 | Reichenbaum . |
| 3,259,814 | * | 7/1966 | Green . |
| 5,461,766 | | 10/1995 | Burward-Hoy . |
| 5,527,743 | * | 6/1996 | Variot . |
| 5,814,536 | * | 9/1998 | Rostoker et al. . |
| 5,933,709 | * | 8/1999 | Chun . |
| 5,963,795 | * | 10/1999 | Schneider et al. . |
| 5,972,736 | * | 10/1999 | Malladi et al. . |
| 5,989,940 | * | 11/1999 | Nakajima . |

\* cited by examiner

Primary Examiner—John F. Niebling
Assistant Examiner—Josetta I. Jones
(74) Attorney, Agent, or Firm—Trop, Pruner & Hu, P.C.

(57) ABSTRACT

A semiconductor device has an integrated heat sink. A package body encapsulates a die and a leadframe. A heat sink is in thermal contact with the die and the leadframe. The heat sink is encapsulated in the package body. The heat sink has a connector (e.g., a threaded connection, a conductive adhesive layer) for attachment to an external heat

7 Claims, 5 Drawing Sheets

INTEGRATED HEAT SINK

The invention relates to an integrated heat sink for an integrated circuit package.

BACKGROUND

Semiconductor devices, such as microprocessors, DRAMs, and ASICs, may contain millions of transistors. These semiconductor devices are typically encapsulated in plastic packages. During operation, these devices generate large amounts of heat. Heat increases a device's electrical resistance which slows down the device and may affect the device's overall performance. Heat also accelerates wear and tear on the device and may reduce the device's overall life expectancy. Therefore, it is desirable to remove heat from semiconductor devices and generally keep them as cool as possible.

U.S. Pat. No. 5,461,766 discloses a heat transfer device for a package in which the base of a heat sink is integrally formed into an integrated circuit package and is abutted to a die in the package. A portion of the heat sink projects from the package, forming a post. A heat transfer assembly having an aperture is heated until the aperture expands sufficiently to allow the heat transfer assembly to be fitted on the post with a minimum of force. Upon cooling, a tight joint is formed between the heat sink and the heat transfer assembly.

There is a need for a simple, cost effective structure for removing heat from integrated circuit packages.

SUMMARY

A heat transfer system for an integrated circuit package may be implemented by encapsulating an internal heat sink into an integrated circuit package. An external heat sink may be readily connected to the internal heat sink using a releasable connection such as a threaded connection or an adhesive connection using conductive paste. By aligning a surface of the encapsulated internal heat sink with a package surface, a good heat transfer surface is provided for heat transfer from an internal to an external heat sink.

In general, in one aspect the invention relates to a method of forming an integrated circuit package containing a semiconductor die including encapsulating the semiconductor die together with an internal heat sink. An external heat sink is connected to the internal heat sink.

In general, in another aspect the invention relates to a semiconductor device including a leadframe, a semiconductor die mounted to the leadframe, and a package body encapsulating the semiconductor die and leadframe. An internal heat sink is encapsulated in the package body with the die. A connector in the internal heat sink is adapted to connect to an external heat sink.

In general, in another aspect the invention relates to an apparatus for removing heat from a semiconductor device having a package body. The apparatus includes an encapsulant and an internal heat sink embedded in the encapsulant. An external heat sink is secured to the internal heat sink in thermal contact with the internal heat sink.

In general, in another aspect the invention relates to an integrated circuit assembly including a support structure and a plurality of integrated circuit devices mounted on the support structure. A heat sink is attached to the plurality of integrated circuit devices.

In general, in another aspect the invention relates to an integrated circuit device connectable to an external heat sink. The device includes a die and a heat sink secured to the die. The heat sink includes a threaded connection for threadedly connecting to the external heat sink.

In general, in another aspect the invention relates to an integrated circuit device including a die. A first heat sink is connected to the die. A second heat sink is secured to the first heat sink by a conductive adhesive.

DETAILED DESCRIPTION

Figure 1A:
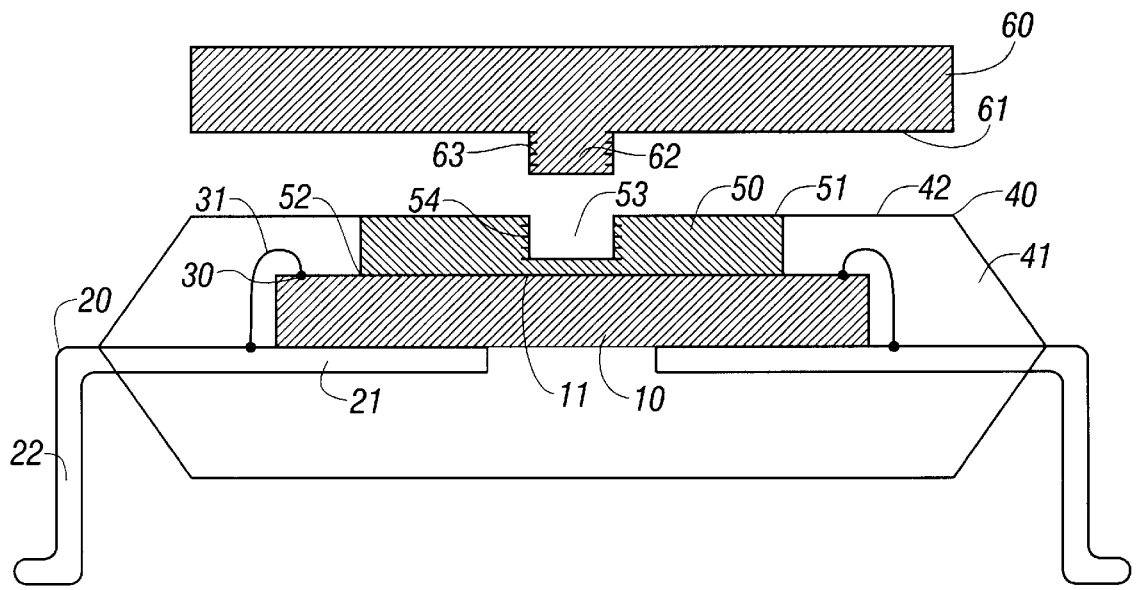
FIG. 1a is an enlarged, exploded cross-sectional view of a semiconductor device having an integrated heat sink and an external heat sink.
Figure 1B:
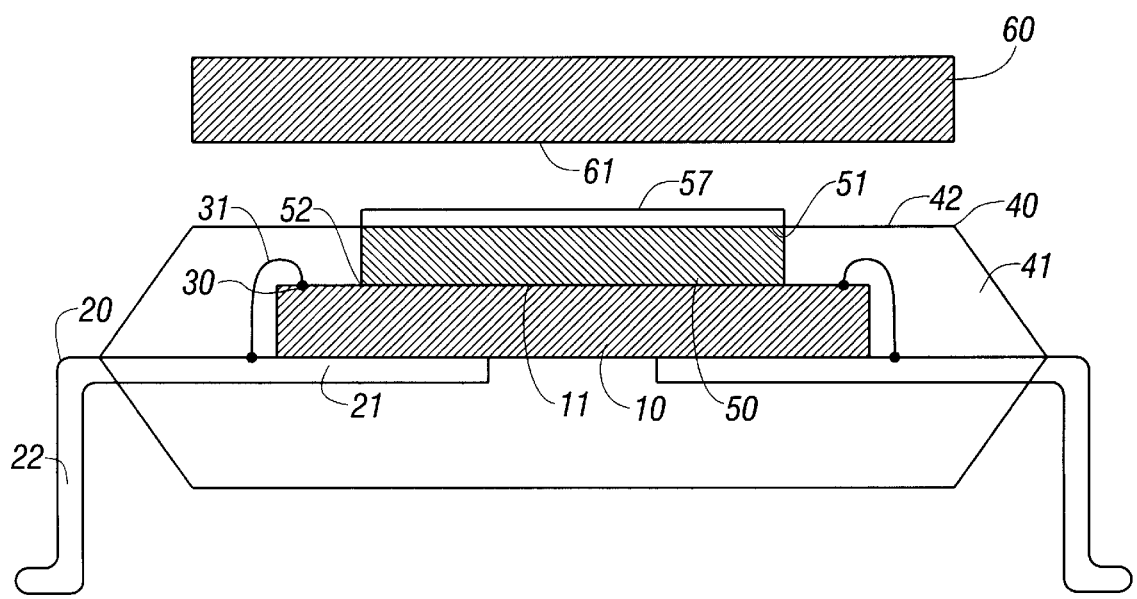
FIG. 1b is an enlarged, exploded cross-sectional view of the embodiment of the semiconductor device in FIG. 1a having a connector which is a layer of adhesive.

Referring to FIGS. 1a–1b, a semiconductor die 10 is attached to a leadframe 20. The die 10 may be an integrated circuit such as a microprocessor or a memory chip. The leadframe 20, which may be made of a metal such as Alloy-22, has lead fingers 21 to which the die 10 is attached. The leadframe 20 also has leads 22, which may be tin plated or solder dipped.

Bonding pads 30 are disposed along a periphery of the die 10 for electrically connecting the die 10 to the leadframe 20. Bonding wires 31, which may be made of gold, connect the bonding pads 30 to the lead fingers 21 of leadframe 20. Alternatively, the bonding pads 30 may be connected to the lead fingers 21 by tab automated bonding.

A package 40 encapsulates the die 10 and leadframe 20. The package 40 may be, for example, a dual inline package (DIP), a small outline j-lead package (SOJ), a thin small outline package (TSOP), as well as other package types. The package 40 has a package body 41 which is made of a material such as plastic, ceramic, or other durable materials.

A heat sink 50, which may be made of a thermally conductive material such as a metal, for example aluminum, is embedded in the package body 41 such that a top surface 51 of the heat sink 50 remains exposed. The top surface 51 of the heat sink 50 is approximately even with the top surface 42 of the package body 41. A bottom surface 52 of the heat sink 50 is abutted to the top surface 11 of the die 10 so that the bottom surface 52 of the heat sink 50 is in thermal conductive contact with the top surface 11 of the die 10. To enhance thermal conductive contact, a thermally conductive paste layer (not shown) may be applied between the integrated heat sink 50 and the die 10.

A cavity 53 is formed in the top surface 51 of the heat sink 50 as shown in FIG. 1a. The cavity 53 may have internal threads 54 to allow a threaded connection to an external heat sink 60. Other connectors may be used as well.

The external heat sink 60 may be mounted on the integrated heat sink 50 using a stub 62 with external threads 63 attached to a bottom face 61. The external heat sink 60 is mounted onto the heat sink 50 by screwing the stub 62 into the cavity 53 until the top face 51 of the heat sink 50 is in thermal contact with the bottom face 61 of the external heat sink 60. The connector 62 on the external heat sink 60 can be modified to conform to the connector 53 formed in the integrated heat sink 50.

An advantage of the semiconductor device in FIG. 1a is that the integrated heat sink 50 may be easily embedded in the package body 41 during assembly as it does not protrude from the package body 41. The integrated heat sink can simply be laid flat in the mold cavity so that it abuts the top or bottom wall of the cavity. When melted plastic (or other encapsulating material) is injected into the cavity, the plastic surrounds the integrated heat sink 50 except for the surface of the integrated heat sink 50 which abuts the top or bottom wall of the cavity.

Alternatively, the integrated heat sink 50 can have a stub 62 and threads 63 formed in its top surface 51 that connect to a cavity 53 with internal threads 54 formed in the bottom surface 61 of the external heat sink 60.

The integrated heat sink 50 can also be connected to the external heat sink 60 by a thermally conductive paste adhesive layer 57 as shown in FIG. 1b. The adhesive is applied between the top surface 51 of the heat sink 50 and the lower surface 61 of the external heat sink 60. Suitable conductive adhesive pastes include those containing silver particles in an adhesive polymer resin.

During operation, heat generated by the die 10 is transferred to the integrated heat sink 50 which is in thermal contact with the die 10. The heat is then conducted through the integrated heat sink 50 to the external heat sink 60 which is in thermal contact with the integrated heat sink 50. The external heat sink 60 then dissipates the heat into the air.

Figure 2:
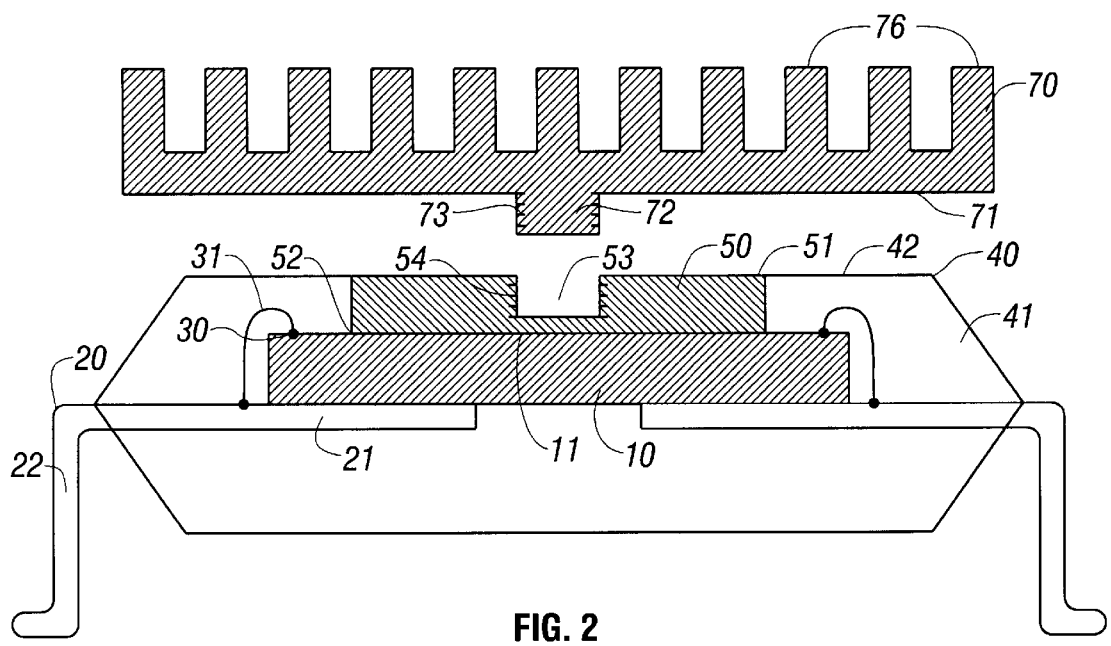
FIG. 2 is an enlarged, exploded cross-sectional view of a semiconductor device having an integrated heat sink and an external heat sink with fins.

Referring now to FIG. 2, the external heat sink 70 can be mounted to the integrated heat sink 50. The external heat sink 70 has a stub 72 and threads 73 formed in its bottom surface 71. The external heat sink 70 also has fins 76 for improved heat dissipation. Alternatively, stub 72 may protrude from the heat sink 50 and engage the threads 54 in cavity 53.

Other configurations of external heat sinks can also be used. For example, the external heat sink can have a heat dissipating area that is much larger than that of the integrated heat sink.

Figure 3:
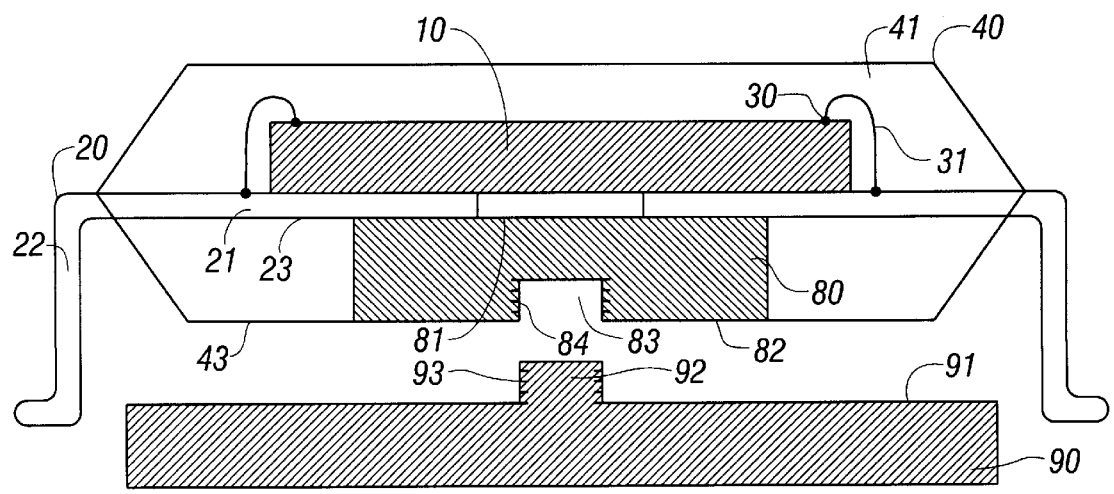
FIG. 3 is an enlarged, exploded cross-sectional view of a semiconductor device having an integrated heat sink abutted to a leadframe and an external heat sink.

Referring now to FIG. 3, a heat sink 80 is abutted to the leadframe 20 rather than the die 10, as shown in FIG. 1a. A top surface 81 of the heat sink 80 is in contact with a bottom surface 23 of the lead fingers 21 of the leadframe 20. The integrated heat sink 80 has a cavity 83 and threads 84 for connecting to an external heat sink 90. The external heat sink 90 may be connected to the integrated heat sink 80 by screwing its stub 92 and threads 93 into the cavity 83 of the integrated heat sink 80 until a bottom surface 82 of the integrated heat sink 80 is in contact with a top surface 91 of the external heat sink 90.

Figure 4:
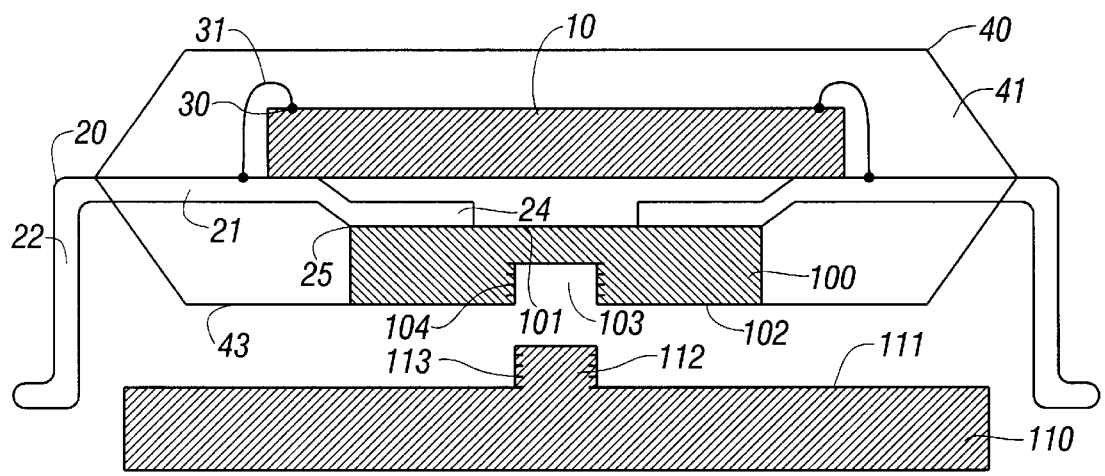
FIG. 4 is an enlarged, exploded cross-sectional view of a semiconductor device having an integrated heat sink, a leadframe having a offset portion, and an external heat sink.

Referring now to FIG. 4, the package has a leadframe 20 with an offset portion 24. An integrated heat sink 100 abuts to a bottom surface 25 of the offset portion 24 such that a top surface 101 of the integrated heat sink 100 is in contact with the leadframe 20.

An external heat sink 110 has a stub 112 and threads 113 for connecting to an aperture 103 and threads 104 of the integrated heat sink 100. The top surface 111 of external heat sink 110 is in thermal contact with a bottom surface 102 of the integrated heat sink 100. The offset portion 24 of the leadframe 20 accounts for the thickness of the heat sink 100.

Figure 5:
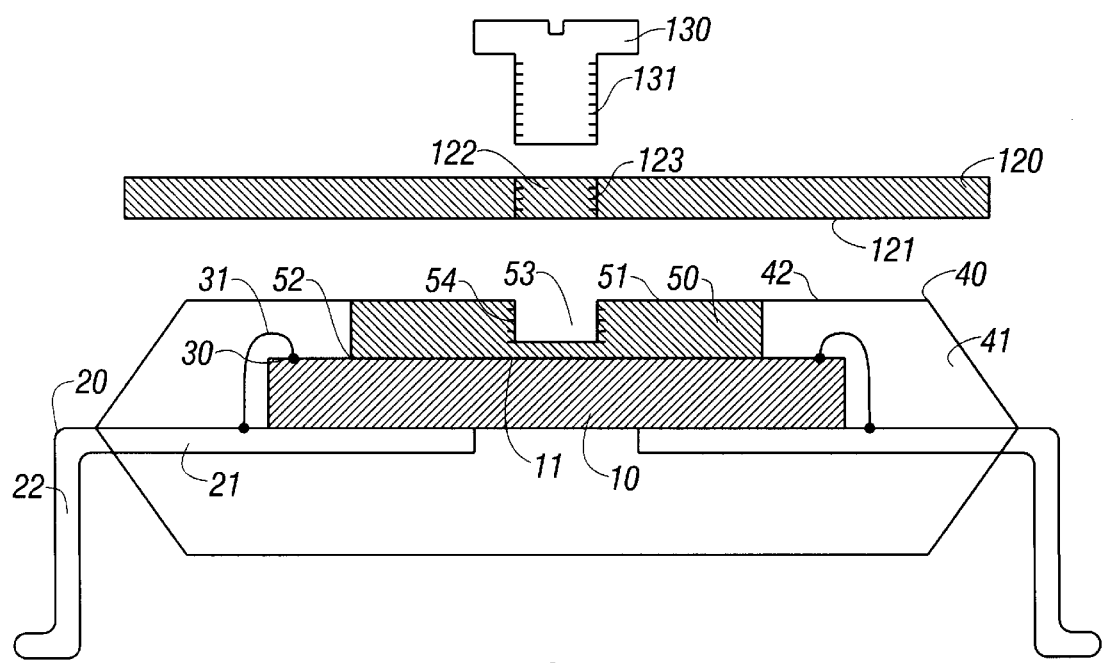
FIG. 5 is an enlarged, exploded cross-sectional view of a semiconductor device having an integrated heat sink, and an external heat sink with a threaded connector.

Referring now to FIG. 5, the external heat sink 120 has a passage 122 and threads 123 for receiving a separate fastener 130, such as a screw, having threads 131. The external heat sink 120 is fastened to the integrated heat sink 50 by screwing the fastener 130 into the passage 122 and the aperture 53 of the integrated heat sink 50 such that a bottom surface 121 of the external heat sink 120 is in thermal contact with the top surface 51 of the integrated heat sink 50.

Figure 6:
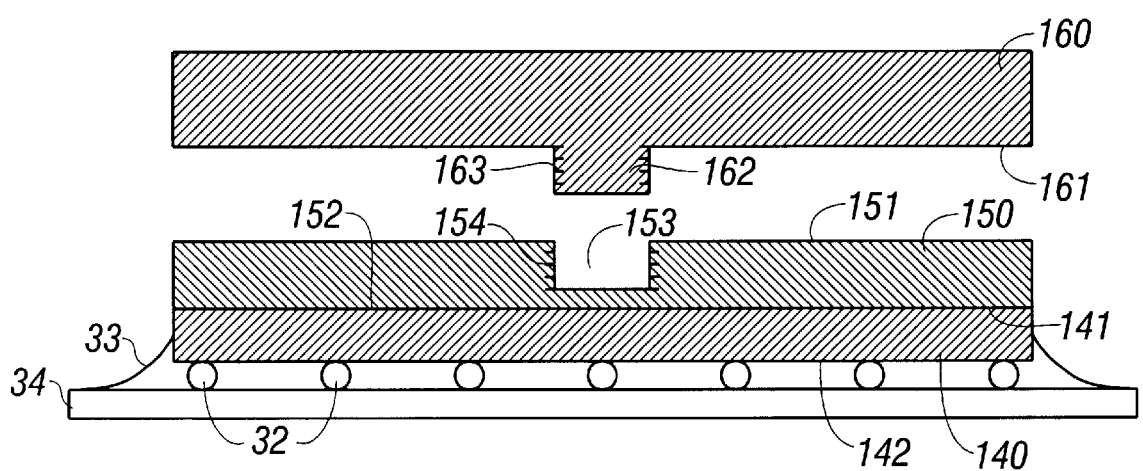
FIG. 6 is an enlarged, exploded cross-sectional view of a flip-chip semiconductor device having an abutting heat sink and an external heat sink.

Referring now to FIG. 6, a bare, unencapsulated flip-chip die 140 is mounted with its top surface 141 facing down on a support substrate 34. The term "flip-chip" comes from the facing down, or flipped, orientation of the die 10 on the support substrate 34. Metal bumps 32 (which may be gold plated) are formed on bonding pads (not shown) of the die 10. The bumps 32 can also be made of a polymer, such as a metal-filled epoxy or a thermoplastic compound. Matching solder pads (not shown) are formed on the support substrate 34 for receiving the bumps 32. The bumps 32 are bonded to the solder pads of the support substrate 34 to electrically connect the die 10 to the support substrate 34.

An integrated heat sink heat sink 150 is abutted to the die 140 such that its bottom surface 152 is in contact with a back surface 142 of the die 140. The integrated heat sink has a connector or an aperture 153 with threads 154 formed in its top surface 151. An external heat sink 160 is connected to the integrated heat sink 150 by screwing a stub 162 and threads 163 of the external heat sink into the aperture 153 until a bottom surface 161 of the external heat sink 160 makes thermal contact with the top surface 151 of the integrated heat sink 150.

The flip-chip assembly of FIG. 6 may have an underfill layer 33 to cover and hermetically seal the bumps 32 which connect the die 140 to the support substrate 34. The underfill layer 33 can be made of, for example, a resin material, and keeps out moisture and protects the bumps 32 from physical stress.

Figure 7:
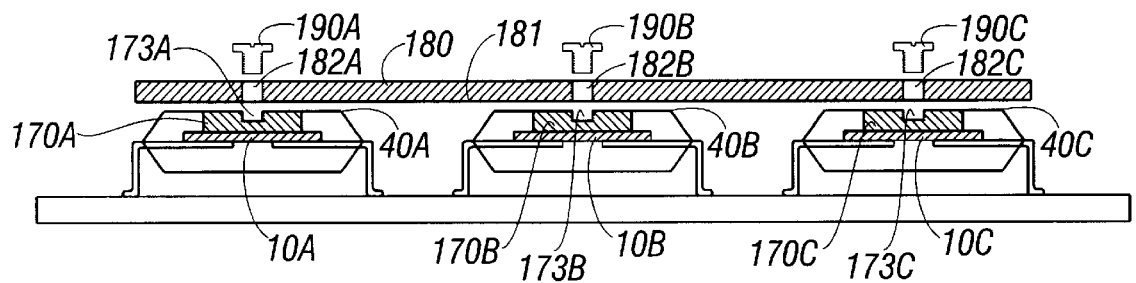
FIG. 7 is an enlarged, exploded cross-sectional view of a plurality of semiconductor devices each having an integrated heat sink and an external multi-device heat sink.

Referring now to FIG. 7, a plurality of packages 40A, 40B, and 40C are mounted on a support substrate 34. The packages 40A, 40B, and 40C have integrated heat sinks 170A, 170B, and 170C which are embedded in the package bodies of packages 40A, 40B, and 40C and in thermal contact with dies 10A, 10B, and 10C. The integrated heat sinks 170A, 170B, and 170C have threaded apertures 173A, 173B, and 173C. A single external heat sink 180 having threaded passages 182A, 182B, and 182C is connected to the integrated heat sinks 170A, 170B, and 170C by fasteners 190A, 190B, and 190C. The fasteners 190A, 190B, and 190C are screwed into the threaded passages 182A, 182B, and 182C of the external heat sink 180 and the threaded apertures 173A, 173B, and 173C of the integrated heat sinks 170A, 170B, and 170C until the external heat sink 180 makes thermal contact with the integrated heat sinks 170A, 170B, and 170C.

Although FIG. 7 shows the packages 40A, 40B, and 40C as having the same height, packages which have different heights may also be used. For packages having different heights, the single external heat sink may have offset portions (not shown) corresponding to the different heights of the packages. Furthermore, other techniques may by used to connect the single external heat sink to the integrated heat sinks 170A, 170B, and 170C, for example, an adhesive layer, or a threaded aperture and stub.

Figure 8:
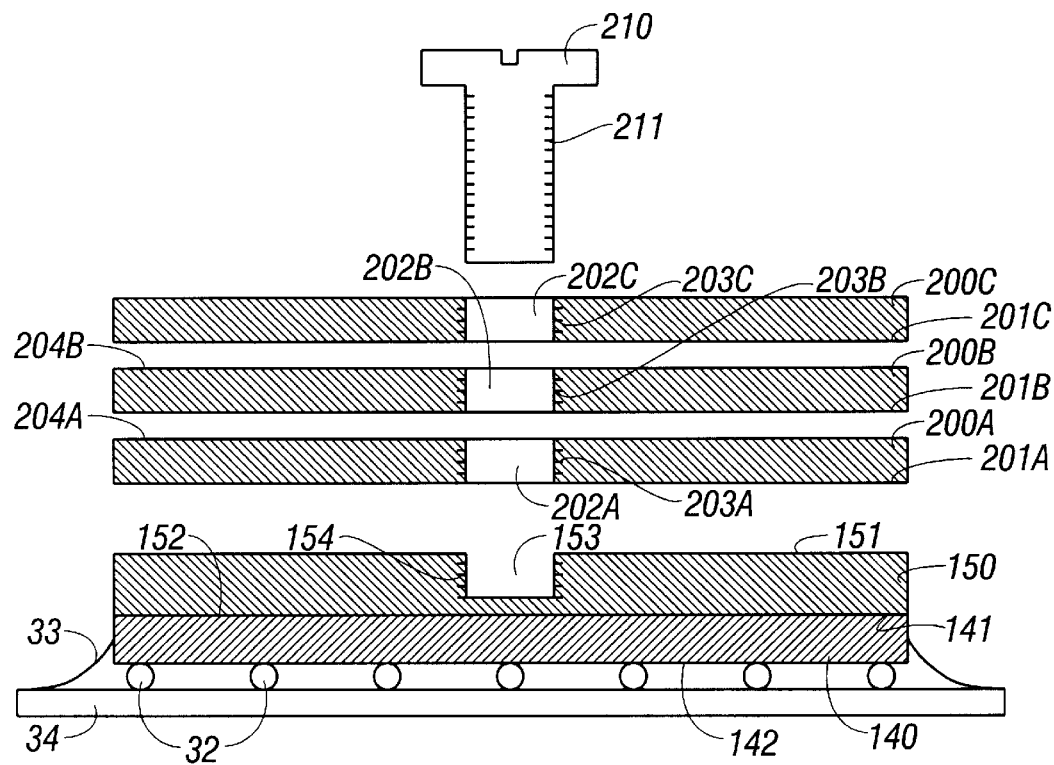
FIG. 8 is an enlarged, exploded cross-sectional view of a flip-chip semiconductor device having an integrated heat sink and a plurality of external heat sinks.

Referring now to FIG. 8, the flip-chip assembly is similar to the flip-chip assembly of FIG. 6 except for multiple external heat sinks 200A, 200B, and 200C. The multiple external heat sinks 200A, 200B, and 200C have passages 202A, 202B, and 202C and threads 203A, 203B, and 203C for receiving a fastener 210. The fastener 210, which has threads 211, is screwed into the passages 202A, 202B, and 202C of the multiple external heat sinks 200A, 200B, and 200C and the aperture 153 of the integrated heat sink 150. A top surface 151 of the integrated heat sink 150 makes thermal contact with a bottom surface 201A of the external heat sink 200A, top surface 204A of the external heat sink 200A makes thermal contact with a bottom surface 201B of the external heat sink 200B, and a top surface 204B of the external heat sink 200B makes thermal contact with a bottom surface 201C of the external heat sink 200C.

It is to be understood that the embodiments described above are merely illustrative of some of the many specific embodiments of the invention, and that other arrangements can be devised by one of ordinary skill in art at the time the invention was made without departing from the scope of the invention. For example, although the drawings show the external heat sink being threadedly attached to the integrated heat sink, other attachment techniques are available, including attachment using a conductive adhesive paste.

What is claimed is:

1. A method of forming an integrated circuit package containing a semiconductor die comprising:

encapsulating the semiconductor die together with an internal heat sink; and connecting an external heat sink to the internal heat sink.

2. The method of claim 1, further comprising abutting the heat sink to the semiconductor die so that the heat sink is in contact with the semiconductor die.

3. The method of claim 2, comprising aligning the internal heat sink with a surface of the package.

4. The method of claim 1, wherein the heat sinks are connected by a threaded connection.

5. The method of claim 1, wherein the second heat sink has a heat dissipating surface area greater than that of the first heat sink.

6. The method of claim 1, including releasably connecting the external heat sink to the internal heat sink.

7. The method of claim 1, including adhering said external heat sink to said internal heat sink using a conductive adhesive.

* * * * *